(12) United States Patent
Levin

(10) Patent No.: US 6,402,978 B1
(45) Date of Patent: Jun. 11, 2002

(54) MAGNETIC POLISHING FLUIDS FOR POLISHING METAL SUBSTRATES

(75) Inventor: Ludmila Levin, Kiriat-Bialik (IL)

(73) Assignee: MPM Ltd., Haifa (IL)

( * ) Notice: Subject to any disclaimer, the term of this patent is extended or adjusted under 35 U.S.C. 154(b) by 0 days.

(21) Appl. No.: 09/563,919

(22) Filed: May 4, 2000

(51) Int. Cl.⁷ .............................. H01F 1/44; H01F 1/02
(52) U.S. Cl. .................. 252/62.52; 51/307; 51/308; 51/309; 451/36; 451/37
(58) Field of Search ................ 252/62.52; 51/307, 51/308, 309; 451/36, 37

(56) References Cited

U.S. PATENT DOCUMENTS

| | | | |
|---|---|---|---|
| 4,821,466 A | 4/1989 | Kato et al. .................... 51/317 |
| 5,449,313 A | 9/1995 | Kordonsky et al. ........... 451/35 |
| 5,525,249 A | 6/1996 | Kordonsky et al. ...... 252/62.56 |
| 5,577,948 A | 11/1996 | Kordonsky et al. ........... 451/35 |
| 5,616,066 A | 4/1997 | Jacobs et al. .................. 451/36 |
| 5,795,212 A | 8/1998 | Jacobs et al. .................. 451/36 |
| 5,804,095 A | 9/1998 | Jacobs et al. ............. 252/62.52 |
| 5,839,944 A | 11/1998 | Jacobs et al. .................... 451/8 |

OTHER PUBLICATIONS

Massarat, *IEEE Transactions of Magnetics*, vol. Mag. 17 (#2), Mar. 1981.

*Primary Examiner*—C. Melissa Koslow
(74) *Attorney, Agent, or Firm*—Eitan, Pearl, Latzer & Cohen-Zedek

(57) ABSTRACT

Magnetic polishing fluid compositions for polishing metal substrates containing colloidal and/or non-colloidal magnetic particles are described. The compositions contain oxidizers and, for example, oxidation inhibitors for assisting in the polishing process. Colloidal polishing particles may also be employed. The compositions are usually highly acidic. Methods for preparing the various polishing fluids compositions are described.

80 Claims, No Drawings

MAGNETIC POLISHING FLUIDS FOR POLISHING METAL SUBSTRATES

FIELD OF THE INVENTION

The present invention relates to magnetic polishing fluids useful for polishing metallic surfaces, particularly metal surfaces in the microelectronic industry.

BACKGROUND OF THE INVENTION

Chemical-mechanical polishing is a commonly used technique for planarization of bare silicon, silica and other ceramic wafers. In chemical-mechanical polishing, the wafers are held against a rotating polishing pad wetted by a slurry consisting of colloidal abrasive particles (silicon dioxide, alumina, cerium oxide, etc.) and specific additives to enhance the rate and quality of polishing. When silica is used, a high pH is required. An oxide or hydroxide surface layer forms on the wafer and the reaction products are removed by mechanical action of the pad and the colloidal silica slurry. Similar processes occur when other abrasives are used.

Copper interconnects in ultra-large scale integrated (ULSI) circuit layouts were introduced relatively recently into the semiconductor industry. They became possible as a result of improvements in chemical-mechanical planarization (CMP) technology developed during the last two decades. The adoption of CMP for polishing or removing thin metal layers, such as copper, aluminum, tungsten, titanium and tantalum layers, has enabled their commercial use and markedly changed semiconductor processing. The CMP techniques presently used for metals are very similar to those used for polishing ceramics described above.

The use of CMP has led to a large increase in the amount of metal being polished in the semiconductor industry. Only ten years ago, the polishing of dielectric ceramics constituted more than 90% of semiconductor materials being polished. The current volume of metal being polished in the industry exceeds by several hundred percent that polished formerly.

The bending and stresses of the rotating polishing pad used in convential CMP polishing, strongly influence the quality of planarization. The adverse effects of a polishing pad can be avoided, or at least mitigated, by using a magnetic polishing fluid which forms a plasticized mass in an a inhomogeneous magnetic field.

Magnetorheological fluids (MRFs) for polishing ceramics and optical materials are known in the art. With MRFs, the polishing pad common to conventional polishing is dispensed with entirely.

The viscosity of magnetorheological fluids increases in a magnetic field and the fluids, which contain magnetic particles, acquire the characteristics of a plasticized solid, that is one exhibiting Bingham properties, forming an abrasive mass with a viscosity and elasticity suitable for polishing.

Typical MRF formulations are discussed in U.S. Pat. Nos. 5,804,095, 5,795,212, 5,525,249, 5,449,313, and 4,821,466. These references when mentioning polishing, do so only in the context of polishing ceramic or optical materials. They do not discuss polishing metal surfaces.

Polishing machines used with prior art MRF compositions causes them to acquire viscous, plasticized properties known as Bingham properties, when under the influence of magnetic forces. When in a magnetic field, the MRF is hard enough to be used as a polishing tool. However, these polishing fluids reach their fully developed Bingham state only at the outset of the polishing process. Once the substrate being polished begins to move relative to the MRF, the shear stress of the abrasion process causes the MRF to lose its Bingham properties and its plasticized characteristics. The MRF remains viscous throughout the process but returns to a liquid, non-plasticized state almost immediately after abrasion begins, reducing polishing efficiency.

The magnetorheological fluids in the above-cited compositions usually provide a mechanical mechanism for the polishing process. In addition, these fluids generally contain magnetic and/or abrasive particles with sizes in excess of 1 $\mu$m. These large size particles, and especially their agglomerates, introduce defects, scratches and non-uniformities onto the surface being treated.

Finally, because of the large size magnetic or abrasive particles used, these fluids have a tendency to settle due to gravitational forces. Because of their size, the abrasive particles act as agglomeration centers, contributing to the aggregation of magnetic particles and to the instability of the magnetic fluid. Any use of such fluids requires prior agitation.

SUMMARY OF THE INVENTION

The present invention relates to magnetic polishing fluid compositions suitable for polishing metal surfaces. In particular, it is suitable for polishing metal interconnects, vias and layers used extensively in current ULSI manufacturing.

One embodiment of the present invention teaches a magnetic polishing fluid composition comprising colloidal size magnetic particles with a mean particle size range from about 0.01 $\mu$m to about 0.15 $\mu$m, colloidal size polishing particles with a mean particle size range from about 0.01 $\mu$m to about 0.1 $\mu$m, at least one stabilizer for stabilizing the colloidal size particles, at least one oxidizer, at least one inhibitor for controlling the rate of oxidation of the oxidizer, and a carrying fluid where the pH of the composition is in the range from between about 0.5 to about 5.5.

In another embodiment based on the above, the magnetic polishing fluid composition does not include the colloidal polishing particles. In yet another embodiment based on the above, the polishing fluid does not contain an inhibitor.

A method for preparing the above compositions includes the steps of preparing a colloidal size magnetic particle dispersion with a stabilizer in a carrying fluid, preparing a colloidal size polishing particle dispersion in a carrying fluid, adding to the colloidal size polishing particle dispersion at least one oxidizer and at least one inhibitor, mixing said colloidal size magnetic particle dispersion and said colloidal size polishing particle dispersion to form a mixture, and adjusting the mixture to a final pH of about 0.5–5.5, if not already at the pH.

In yet another embodiment, a multi-phase magnetic composition, a magnetic polishing fluid composition contains both colloidal and non-colloidal magnetic particles. The non- colloidal magnetic particles have a mean particle size range from about 0.15 $\mu$m to about 3.0 $\mu$m and the colloidal magnetic particles have a mean particle size range from about 0.01 $\mu$m to about 0.15 $\mu$m. The composition also contains at least one oxidizer, at least one inhibitor for inhibiting the rate of oxidation of the oxidizer, at least one stabilizer for stabilizing said colloidal particles, an additive for adjusting viscosity, and a carrying fluid. The pH of the final composition is in a range from about 0.5 to about 5.5.

Yet another embodiment based on the embodiment discussed immediately above, does not include an inhibitor. A second multi-phase embodiment does not require colloidal polishing particles.

The invention also teaches a method for producing the above composition comprising the steps of preparing a non-colloidal size magnetic particle dispersion by adding the particles to a mixture of a viscosity additive in a carrying fluid. This is followed by preparation of a colloidal size magnetic particle dispersion with a stabilizer in a carrying fluid. This is further followed by preparing a colloidal size polishing particle dispersion in a carrying fluid and adding to the colloidal size polishing particle dispersion at least one oxidizer and at least one inhibitor. The colloidal size magnetic particle dispersion and the colloidal size polishing particle dispersion are mixed to form an intermediate mixture, which is then mixed with the non-colloidal size magnetic particle dispersion. Finally, the pH of the composition is adjusted to a pH in the range of about 0.5 to about 5.5, if the composition is not already at the proper pH in that range.

In yet another embodiment, a magnetic polishing fluid composition is taught which comprises magnetic particles having a mean particle size range from about 0.15 to about 3.0 μm, colloidal size polishing particles having a mean particle size range from about 0.01 to about 0.1 μm, at least one oxidizer, at least one inhibitor for inhibiting the rate of oxidation by the oxidizer, at least one stabilizer for stabilizing the colloidal particles, an additive for adjusting viscosity, and a carrying fluid where the pH of the composition is from about 0.5 to about 5.5

Various specific compositions are taught by the present invention. One such composition includes colloidal size magnetic particles comprised of colloidal size magnetite ($Fe_3O_4$) particles. These particles have a weight percent content of the total composition ranging from about 20 to about 55 wt %. Colloidal size polishing particles comprising colloidal size alumina ($Al_2O_3$) particles have a weight percent content in the total composition ranging from about 1 to about 20 wt %. Other components in the composition include an oxidizer comprising $Fe(NO_3)_3$ having a weight percent content ranging from about 1 to about 10 wt. %, an inhibitor comprising $K_2Cr_2O_7$ having a weight percent content in said composition ranging from about 0.01 to about 2 wt. %, a stabilizer comprising perchloric acid having a weight percent content ranging from about 0.5 to about 20 wt. %, and a carrier fluid adjusted to a pH in the range of about 0.5 to about 5.5 comprising any remaining wt % of said composition.

Another composition taught by the invention includes non-colloidal size magnetic particles selected from carbonyl iron or magnetite particles. These particles have a weight percent content in the final composition of from about 21 to about 38.5 wt %. Colloidal size magnetic particles comprising colloidal size magnetite particles having a weight percent content in said composition from about 3 to about 7.5 wt %, and colloidal size polishing particles comprising colloidal size alumina particles having a weight percent content in said composition from about 1 to about 10 wt % are two other components of the system. A stabilizer comprising perchloric acid has a weight percent content in the composition from about 0.5 to about 10 wt. %, an oxidizer comprising ferric nitrate has a weight percent content in said composition ranging from about 1 to about 10 wt %, an inhibitor comprising potassium dichromate has a weight percent content in the composition ranging from about 0.01 to about 2 wt %, a viscosity adjusting additive comprising polyethylene glycol has a weight percent content in the final composition from about 0.1 to about 5 wt %, and a carrier fluid, adjusted to a pH in the range from about 0.5 to about 5.5, comprises any remaining wt % of the final composition.

A third composition taught includes non-colloidal magnetite particles having a weight percent content in the final composition ranging from about 20 to about 55 wt %, colloidal size polishing particles comprising colloidal size alumina particles having a weight percent content in the composition ranging from about 1 to about 20 wt %, a stabilizer comprising perchloric acid having a weight percent content in the composition ranging from about 0.5 to about 20 wt. %, a viscosity additive comprising polyethylene glycol having a weight percent content in the composition ranging from about 0.1 to about 10 wt. %, an oxidizer comprising ferric nitrate having a weight percent content ranging from about 1 to about 10 wt. %, an inhibitor comprising potassium dichromate having a weight percent content ranging from about 0.01 to about 2 wt. %, and a carrier fluid, adjusted to a pH in the range from about 0.5 to about 5.5, comprises any remaining wt % of said composition.

DETAILED DESCRIPTION OF THE INVENTION

The present invention relates to various magnetic polishing fluid (MPF) compositions that can be used to polish metal substrates, and even some ceramic-like materials. Among the metals that can be polished are copper, aluminum, tungsten, titanium, and tantalum and among the ceramics which can be polished are TiN and TaN. The compositions are particularly advantageous as MPFs for polishing copper interconnects in the semiconductor industry. They can also polish the dielectric layers often present in semiconductor multi-layers. By varying the details of the formulation of these MPFs, the rate and quality of polishing can be controlled. The magnetic polishing fluids of the present invention polish at lower viscosities than the MRFs cited above, thereby producing better quality surfaces.

In the present invention an oxidizer is used to create a metal oxide on the surface of a metal. In general metal oxides are softer and therefore more easily polished then pure metals. The rate of polishing depends on the concentration of oxidizer present. Usually, the inhibitor is added to control the rate of polishing by slowing the rate of oxidation of the metal surface.

A magnetic polishing fluid (MPF) in a magnetic field, although forming a plasticized mass when the field is activated, retains or reverts to the properties of a liquid during the polishing process. When in its plasticized state the mass possesses Bingham properties.

A magnetic polishing fluid comprising magnetic particles, responds to a magnetic field gradient by increasing its viscosity and changing into a plasticized mass. Any polishing particles contained in the fluid are trapped in the plasticized mass and pushed out of the fluid in a direction perpendicular to the gradient.

This mass is an effective polishing tool when it comes into contact with a moving work surface. Upon contacting the polishing surface, and under the shear stress of the abrasion process, the plasticized mass reverts back to an almost liquid state.

In addition, when a polishing solution contains magnetic particles, particularly magnetic particles of non-colloidal size, the particles interact and form dendritic structures when plasticized under the influence of magnetic fields. These plasticized structures contain pores. A liquid media containing a polishing slurry comprising colloidal abrasive particles can fill the pores in the plasticized structure. The polishing rate is enhanced when the pores in the plasticized polishing mass are filled in this manner. The liquid containing the abrasive particles rises to the surface of the plasticized mass through capillary action. At the surface, the polishing particles are pressed by the polishing machine against the work surface.

The magnetic polishing fluids of the present invention usually comprise at least one type of magnetic particles, colloidal size abrasive particles, at least one oxidizer, at least one inhibitor, at least one stabilizer, and a carrying fluid. In one embodiment, the magnetic particles are of colloidal size and first dispersed in a stabilizer in a carrying fluid before mixing with colloidal abrasive particles. In another embodiment, two sizes of magnetic particles are used, one colloidal and one non-colloidal. Each size of magnetic particle is dispersed separately in its own carrying fluid before the two dispersions are mixed. Usually, inhibitors and oxidizers are added to the colloidal polishing particle dispersion. The oxidizer can however be kept separate and added to the solution only immediately prior to polishing.

For purposes of the present invention, colloidal size magnetic particles are deemed to be particles with mean particle sizes of about 0.15 $\mu$m or less, while colloidal size polishing particles are deemed to be particles with mean particle sizes of about 0.1 $\mu$m or less.

Certain embodiments of the invention may require a viscosity additive to control viscosity and/or a pH additive to adjust pH. Additives to increase the rate and enhance the quality of the polishing process can be added to the composition, as needed. In all the embodiments discussed, there is little agglomeration or sedimentation in the fluid over a period of one year at room temperature. The composition will be ineffective if the oxidizer is not kept separate from the rest of the composition when the composition is stored for long periods of time.

The magnetic particles used in these compositions can be chosen from many different ferrous and non-ferrous magnetic materials. These include, but are not limited to, ferromagnetic metals such as Fe, Ni, and Co, their alloys, ferrites, chromium oxides such as $CrO_2$, iron oxides such as $Fe_3O_4$, iron phosphides, and cobalt oxides such as $Co_3O_4$. Carbonyl iron or magnetite ($Fe_3O_4$), particularly the latter, are the preferred sources for non-colloidal size magnetic particles. The preferred mean particle size range for non-colloidal magnetic particles is generally about 0.15–3.0 $\mu$m, and even more preferably 0.5–1.0 $\mu$m.

Capillary action is needed to transport the liquid containing the abrasive colloidal particles to the surface of the plasticized magnetic particle mass. The magnetic particles form quasi-columns with the pathways between them thought of as capillary tubes. The average diameter of the capillary is determined by magnetic particle size. The capillary must be narrow enough to generate a large capillary force but not so narrow as to be clogged by abrasive particles. A rough calculation based on these principles, assuming abrasive particles with diameters of about 0.1 micron, can establish 3 microns as an approximate upper bound for the magnetic particles that should be used.

Colloidal magnetite, the preparation of which is described below, is the preferred source of colloidal magnetic particles. The particles are formed from a mixed ferrous-ferric chloride solution to which either ammonium hydroxide, NaOH or urea is added. Methods for preparing colloidal magnetite other than the one disclosed herein below can also be used, such as the method of Massarat (IEEE Transactions of Magnetics, Vol. Mag 17 (#2) March 1981). Colloidal magnetic dispersions are also commercially available from manufactures such as Ferrofluids, Inc. The preferred mean particle size range for colloidal magnetic particles is generally about 0.01–0.15 $\mu$m, preferably 0.03–0.05 $\mu$m.

Colloidal size polishing particles can be chosen from many types of oxides, such as $\alpha$-$Fe_2O_3$, $Al_2O_3$, $MgO$, $MnO_2$ or $SiO_2$. Colloidal size particles of carbides e.g. SiC, nitrides e.g. $Si_3N_4$ and polycrystalline diamond can also be used as abrasives. The colloidal polishing particles, preferably alumina ($Al_2O_3$), generally have a mean particle size range of about 0.01–0.1 $\mu$m. An even more preferred mean particle size range for the polishing particles is 0.03–0.05 $\mu$m. In the case of diamond, nanometer size particles can be used.

The metal polishing mixtures also include an oxidizer selected from the group consisting of $Fe(NO_3)_3$, $H_2O_2$, $KIO_3$, and $K_3[Fe(CN)_6]$ with the first two being most preferable. The fluid usually includes an inhibitor selected from the group consisting of toluidine, $\beta$-naphthylamine, $K_2CrO_4$, $K_2Cr_2O_7$, $K_2MoO_4$, and benzotriazol, preferably at least one of the last three. The oxidizer is needed for producing a thin oxide film on the metal substrate and the inhibitor is required for passivation of the metal surface, thereby controlling the rate of polishing. The exact choice of additives and inhibitors depends on the metal being polished.

A stabilizing additive for the polishing agent can be chosen from many different non-ionic, anionic and cationic stabilizers. In a preferred embodiment of the invention the stabilizing agent is perchloric acid ($HClO_4$), which also helps adjust pH. Other stabilizers which can be used are $Fe(NO_3)_3$, polyethylene (10) isooctylphenyl, polydispersed nonylphenol, sodium polyethoxylate, sodium dodecylsulfonate, decylmethylsulfoxide and sodium lignosulfonates. The same stabilizer is usually, but not necessarily, used to stabilize both the colloidal size magnetic and colloidal size polishing particles. Use of low molecular weight stabilizers is preferred since high molecular weight stabilizers, and in particular polymeric surfactants, decrease the rate of polishing, sometimes by as much as a factor of four or five.

All of the magnetic fluids require a carrying fluid. The preferred carrier fluid is usually water, and even more preferably de-ionized water. Water is particularly advantageous when organic residues would be problematic as is often the case is in the microelectronic industry.

Other carrying fluids can also be used. These include, but are not limited to, polar organic solvents, such as alcohols and ketones, as well as mixtures of water and polar organic solvents.

In some embodiments, especially those using non-colloidal magnetic particles, viscosity additives are required. These can be chosen from water soluble polar polymeric materials, such as polyalcohols having molecular weights (MW) of about 300,000 to about 1,000,000. A preferable viscosity additive is polyethylene glycol (PEG). A typical static viscosity, that is the viscosity of the composition when not being used for processing, is about 300–1200 cps.

The pH of the magnetic fluid composition should be from about 0.5 to about 5.5, preferably 1.5–4.5. The exact pH of a composition depends on its intended use. Tungsten can be polished with compositions having pHs of about 4.1–4.2, while polishing aluminum requires compositions with pHs of about 1.9–2.0. The pH is adjusted using organic and inorganic acids such as acetic acids, $HClO_4$, $H_2SO_4$, $HNO_3$ and HCl, with the last three being most preferred.

The MPFs of the present invention can be prepared in several ways, the exact method of preparation depending on the composition of the fluid. A preferable method for preparing the MPFs of this invention is a multi-step process.

When non-colloidal size magnetic particles are used, a dispersion of such particles in a carrying fluid is prepared. The particles are usually dispersed in the presence of a viscosity additive, after the additive has been mixed into the carrier fluid. When the carrier fluid itself is a multi-component system, the carrier fluid is usually prepared from its components prior to adding the viscosity additive.

The method for preparing a colloidal magnetic particle dispersion is similar to that of the non-colloidal one discussed immediately above except that a stabilizer replaces the viscosity additive. The colloidal magnetic powder can be purchased or synthesized. When the colloidal powder is synthesized, the stabilizing agent is usually added directly to the powder immediately after synthesis. Colloidal size iron particles can be synthesized as described in Example II below or by other methods described in the literature.

A dispersion of stabilized colloidal size polishing particles in a carrying fluid is then prepared. The stabilized colloidal dispersion can be prepared by any known method. Commercially available colloidal polishing particle dispersions can also be used. After the colloidal polishing solution is prepared, at least one oxidizer and at least one inhibitor is added.

After the colloidal polishing particle dispersion and either the non-colloidal magnetic particle or the colloidal magnetic particle dispersion have been prepared, the magnetic particle dispersion and the polishing dispersion are mixed slowly with vigorous stirring. Finally, the pH of the mixture is adjusted to a value from about 0.5 to about 5.5, preferably 1.5–4.5, if the mixture is not already at a pH in that range.

The magnetic particle, polishing particle and stabilizer contents in the final MPF composition range from about 20 to 55, from about 1 to 20, and from about 0.5 to 20 wt. %, preferably from about 25 to 35, from about 3 to 15, and from about 1 to about 8 wt. %, respectively. When a viscosity additive is required, it is present in the final MPF composition in a wt % varying from about 0.1 to about 10 wt %, preferably from about 1 to about 5 wt %. The concentrations of the oxidizer and inhibitor are from about 1 to about 10 wt % and from about 0.01 to about 2 wt %, preferably from about 2 to about 7 wt % and from about 0.03 to about 0.9 wt % %, respectively. Generally, the larger the wt % of stabilizer used, the slower the rate of polishing. It is to be understood that here and elsewhere in the specification when weight percents do not total 100%, the remainder is made up of carrying fluid, adjusted to the proper pH as described above.

A multi-phase magnetic polishing fluid can be prepared as follows. Separate dispersions of non-colloidal magnetic particles, colloidal magnetic particles and colloidal polishing particles are prepared as described above. At least one oxidizer and at least one inhibitor are added directly to the colloidal polishing dispersion. After the three dispersions have been prepared, the stabilized colloidal polishing particle dispersion is slowly added to, and mixed vigorously with, the stabilized colloidal magnetic particle dispersion to form an intermediate dispersion. The intermediate dispersion is gradually mixed with the non-colloidal magnetic particle dispersion, while stirring vigorously. Finally, the pH of the mixture is adjusted to a value from about 0.5 to about 5.5, preferably 1.5–4.5, if the mixture is not already at a pH in that range.

The proportions of non-colloidal magnetic, colloidal magnetic and colloidal polishing particles in the final MPF composition range between 21–38.5, 3–7.5 and 1–10 wt %, preferably 25–28, 3.75–5.25 and 3–5 wt %, respectively. The proportions of the stabilizer and viscosity additive range from about 0.5 to 10 wt % and from about 0.1 to 5 wt. %, preferably from about 0.5 to 5 wt % and from about 1 to 5 wt. %, respectively. The concentrations of the oxidizer and inhibitor range from about 1 to 10 wt % and from about 0.01 to 2 wt %, preferably from about 2 to 7 wt % and from about 0.03 to 1.2 wt %, respectively. In general, the ratio of non-colloidal to colloidal magnetic particles should be about from about 4.9:1 to about 6.1:1, preferably from about 5.3:1 to about 5.7:1.

In the multi-phase embodiment, a method of preparation was described wherein the colloidal polishing particle dispersion is first mixed with a colloidal magnetic particle dispersion. The resulting intermediate dispersion is then further mixed with the non-colloidal magnetic particle dispersion. An alternate, but equally acceptable, procedure would be to first mix the abrasive and non-colloidal magnetic dispersions to form an intermediate dispersion which in turn would be mixed with the colloidal magnetic dispersion.

While in previous embodiments, the oxidizers are added during the preparation of the polishing fluid, in other embodiments the oxidizer can be added to the other already mixed components immediately prior to the final composition's use. This extends the shelf-life of the MPF.

In previously described embodiments, a colloidal polishing solution is always part of the MPF. Other MPF embodiments, suitable for certain purposes, do not have to contain a colloidal polishing agent. Satisfactory polishing results can be obtained in certain situations.

Finally, while in previously described embodiments an inhibitor is present, this is not always necessary. It has been found that reasonable polishing results may be obtained for certain purposes and under certain conditions without an inhibitor being present in the MPF.

The polishing fluids of the present invention can be used with most of the magnetic polishing machines discussed in the literature. Typical magnetic polishing machines are described in U.S. Pat. Nos. 4,821,466, 5,449,313, 5,577,948, 5,616,066, and 5,839,944. In addition, the compositions of the present invention were tested using a polishing machine that employs a series of intermittent impacts from a plasticized quasi-solid MPF.

The polishing fluids described in this Application can be used to polish metal interconnects, plugs and layers for the microelectronics industry, metallic tubing, and other metal surfaces.

The following are several magnetic polishing fluid compositions prepared using the procedures described above.

EXAMPLE I

A carrying fluid for preparing a dispersion of non-colloidal magnetic particles was formed by dissolving of 1 g polyethylene glycol (1000000 g/mol) in 99 g of de-ionized water. A dispersion of non-colloidal magnetic particles was prepared by mixing 90 g magnetite ($Fe_3O_4$) powder with 10 g of the polyethylene glycol/water carrying fluid. Powdered $Fe_3O_4$ (Aldrich, particle size 3 $\mu$m) was triturated in a laboratory grinder for an hour until the powder had a particle size of between about 0.5 and 1 $\mu$m.

Colloidal magnetite ($Fe_3O_4$) was synthesized according to the following procedure. Aqueous solutions of Fe (III)

chloride and Fe (II) chloride, each 10 wt % in their respective iron chloride, were mixed. The final molar ratio in the mixture was 2:1 $FeCl_3:FeCl_2$. A 25% aqueous solution of $NH_4OH$ was added to the mixture so that the molar ratio of Fe (II)/$NH_3$ was 19:1 in the mixture.

The solution was carefully stirred to hydrolyze the iron salts, forming a colloidal magnetite ($Fe_3O_4$) dispersion (particle size 0.01–0.02 μm). A stabilizing agent, 2 M perchloric acid, in an amount of 10 wt % with respect to the magnetic powder was added to the colloidal magnetite dispersion immediately after the $Fe_3O_4$ was formed. The stabilized dispersion was concentrated by vacuum filtration to a magnetite content of 30 wt. %.

50 g of a dispersion, containing 50 wt. % $Al_2O_3$, (Metron, particle size 0.02 μm) was gradually added to 50 g of the colloidal magnetic particle dispersion while stirring vigorously. The colloidal magnetic particle and colloidal $Al_2O_3$ particle content in the final dispersion were 17.8 and 25 wt. %, respectively. The final product was a homogeneous fluid with a pH of 2.7. At this point, 13.4 g of $Fe(NO_3)_3$ and 2.1 g of $K_2CrO_4$ were added to the polishing particle dispersion.

50 g of the non-colloidal magnetic particle dispersion were gradually added to 50 g of the dispersion containing the colloidal $Fe_3O_4$ and $Al_2O_3$ particles. During the addition process, the mixture was vigorously stirred. The non-colloidal magnetic particle, colloidal magnetic particle, and colloidal abrasive particle content in the final product was 45, 8.9, 12.5 wt. %, respectively. Nitric acid was added to adjust the pH of the final product to 1.9 The oxidizer ($Fe(NO_3)_3$) and the inhibitor ($K_2CrO_4$) concentrations in the final product were 7 wt. % and 0.9 wt. %, respectively.

EXAMPLE II

A non-colloidal/colloidal magnetic/abrasive particle multi-phase MPF was prepared as in Example I. Benzotriazol was also added as an inhibitor to the polishing particle dispersion prepared in Example I. The final pH was adjusted with KOH and acetic acid to a value of 4.1. The final concentrations of $H_2O_2$, $K_2CrO_4$ and benzotriazol were 7 wt. %, 2.5%, and 0.5%, respectively.

The results of polishing metal surfaces with the MPFs produced in Examples I and II are shown in Table I below.

TABLE I

| Example No. | Polished Material | Removal Rate, Å/min | Roughness, Å | WIWNU, % |
|---|---|---|---|---|
| I | Al | 1800–2800 | 4.48 | 7 |
| II | Cu | 2000–3000 | 6.22 | 2.5 |

When examined the polished metal substrates of Table I showed a "peak to valley" value of less than 100 Å, few scratches and no dishing. As seen from the Table, roughnesses of between ~5–10 Å and polishing rates of ~250 nm/min were attainable.

Removal rate was determined by measuring sheet resistance using a conventional four point probe and surface roughness was measured using an atomic force microscope located at the Wolfson Applied Materials Research Center of Tel Aviv University.

Another series of polishing experiments was carried out on silicon wafers covered with thin metallic and dielectric layers. Patterned wafers were also polished. Thicknesses of the metal layers were measured using a four point probe; roughness was measured by an atomic force microscope (AFM) and dishing and dielectric erosion were measured using an atomic force microscope (AFM) and/or a scanning electron microscope (SEM).

EXAMPLE III

A multiphase MPF with a ratio of non-colloidal to colloidal magnetic particles of 5.75:1 was prepared. The MPF contained 4 wt % ferric nitrate and 1% potassium dichromate and had its pH adjusted with nitric acid to 1.9. The silicon wafer was covered with a layer of TiN and then a layer of Ti. Each layer had a thickness of ~500 Å. The multi-layer was capped by an ~7000 Å layer of aluminum. Within 120 seconds of the start of polishing, all the surface coatings were ground away and the underlying silicon substrate was reached. The removal rate was calculated as ~450 nm/min. The roughness of the silicon wafer after removal of the layers was ~8.8 Å.

EXAMPLE IV

The same MPF as in Example III was used on a wafer similar to the one in that Example. Dishing, i.e. the extent of concavity, as determined by a SEM on three different sites on the wafer was found to be less than 150 Å.

EXAMPLE V

A sputtered ~500 Å film of TiN was laid down on a silicon wafer. The wafer was then coated by an ~8000 Å thick layer CVD deposited tungsten. The wafer was polished using an MPF similar to that of Example I but with a ferric nitrate concentration of 7%. Another wafer was polished using an MPF similar to that of Example I but using 7 wt % hydrogen peroxide as an oxidizer rather than ferric nitrate. Both MPFs had their pH adjusted to 1.8 using nitric acid. The removal rate for the peroxide MPF was calculated as 2400 Å/min; the ferric nitrate MPF had a removal rate of 3900 Å/min. Roughness of the wafer surface was 40.2 Å and 9.28 Å for the hydrogen peroxide and ferric nitrate MPFs respectively.

EXAMPLE VI

A patterned test wafer having tungsten interconnects was polished using the ferric nitrate MPF of Example V. Dishing, as measured by a SEM, showed that when the tungsten interconnect was narrower than three microns, dishing was negligible. When the line was wider than 100 microns, dishing was less than 300 Å.

EXAMPLE VII

A silicon wafer coated with a 500 Å barrier layer of TiN was further coated with a 5000 Å of copper. Three MPFs were use to polish the wafers, a non-colloidal magnetic particle MPF, a colloidal magnetic particle MPF and a multi-phase MPF. All three MPFs contained 2 wt % potassium ferricyanide as an oxidizer. All had their pH fixed at 2.1 by adding nitric acid and acetic acid, with the latter also serving as a buffer. The results are shown in Table II below.

TABLE II

| MPF | Removal Rate, Å/min | Roughness, Å | WIWNU % |
|---|---|---|---|
| Colloidal | 650 | <2.0 | 3.78 |
| Non-colloidal | 2400 | 15.2 | 5.8 |
| Multi-phase | 2310 | 4.88 | 4.4 |

The optimal ratio of non-colloidal to colloidal magnetic particles in multi-phase MPFs was experimentally determined. A series of plasma enhanced chemical vapor deposition PECVD TEOS silica (plasma enhanced chemical vapor deposition, tetraethylorthosicate silica) wafers was polished using a multi-phase MPF with a constant 25 wt. % non-colloidal magnetic particle content. The wt % of the colloidal magnetic particles in the MPF was varied. The following were the results of the experiments:

TABLE III

| Non-colloidal: colloidal magnetic particle ratio | WIWNU, % | Removal rate, Å/min |
|---|---|---|
| 3 | 6.3 | 2882 |
| 4 | 6.0 | 2800 |
| 4.5 | 5.6 | 2790 |
| 5 | 2.8 | 2750 |
| 5.2 | 2.6 | 2740 |
| 5.5 | 2.4 | 2720 |
| 6 | 2.4 | 2680 |
| 6.1 | 2.4 | 2650 |
| 6.5 | 2.4 | 2200 |
| 7 | 2.5 | 1800 |
| 7.5 | 2.7 | 1600 |

Surprisingly, the results of the experiments show that while removal rate decreases essentially monotonically with additional colloidal size magnetic particles, within wafer non-uniformity (WIWNU) does not. There appears to be a broad minimum in the WIWNU figure of merit. The optimal range for the non-colloidal/colloidal particle ratio in a multi-phase system appears to be somewhere between 4.9:1 and 6.1:1, preferably between about 5.3:1 and 5.7:1.

The formulation prepared in Example I and used to polish aluminum can also be used to polish titanium and titanium nitride, among other substrates. The formulation of Example II used to polish copper can also be used to polish tungsten, among other metals.

EXAMPLE VIII

Two multiphase MPF compositions were prepared. Both had a ratio of non-colloidal to colloidal magnetic particles of 5.75:1, and both contained 4.5% $Al_2O_3$ and 2.5 wt. % of hydrogen peroxide. One composition also contained 0.5 wt. % potassium dichromate as an inhibitor. Both compositions had their pH adjusted to 1.9 with nitric acid.

The two compositions where used to polish silicon wafers coated with an approximate 7000 Å layer of aluminum. The composition with the inhibitor polished away the entire metal coating and reached the underlying silicon substrate within 150 seconds of the start of polishing. The composition without the inhibitor accomplished the same in 130 seconds. The removal rate was calculated as 280 nm/min and 323 nm/min for the inhibited and uninhibited compositions, respectively. The roughness of the polished silicon wafers after their aluminum layers had been polished away was 24.8 Å and 40.1 Å for the inhibited and uninhibited compositions, respectively.

EXAMPLE IX

A multiphase MPF without abrasive particles was prepared. The MPF contained 4.5 wt % ferric nitrate and 1 wt. % potassium dichromate. The composition's pH was adjusted with nitric acid to 1.9. A silicon wafer coated with an ~7000 Å layer of aluminum was polished using the above composition. Within 450 seconds of the start of polishing, the entire surface coating was ground away and the underlying silicon substrate was reached. The removal rate was calculated as ~120 nm/min. The roughness of the wafer after removal of the layer was ~10 Å.

While preferred embodiments of the present invention have been described so as to enable one of skill in the art to practice the present invention, the preceding description is intended to be exemplary only. It should not be used to limit the scope of the invention, which should be determined by reference to the following claims.

What is claimed is:

1. A magnetic polishing fluid composition comprising:
   colloidal size magnetic particles, wherein said magnetic particles have a mean particle size range from about 0.01 μm to about 0.15 μm;
   colloidal size polishing particles, wherein said polishing particles have a mean particle size range from about 0.01 μm to about 0.1 μm;
   at least one stabilizer for stabilizing said colloidal size particles;
   at least one oxidizer;
   at least one inhibitor for controlling the rate of oxidation of the oxidizer; and
   a carrying fluid;
   wherein the pH of said composition is in the range from between about 0.5 to about 5.5.

2. A composition according to claim 1 wherein said at least one oxidizer is selected from a group consisting of $Fe(NO_3)_3$, $H_2O_2$, $KIO_3$, and $K_3[Fe(CN)_6]$.

3. A composition according to claim 1 wherein said at least one inhibitor is selected from a group consisting of benzotriazol, toluidine, β-naphthylamine, $K_2Cr_2O_7$, $K_2MoO_4$ and $K_2CrO_4$.

4. A composition according to claim 1 wherein said colloidal size magnetic particles have a mean particle size range of about 0.03 μm to about 0.05 μm.

5. A composition according to claim 1 wherein said colloidal size magnetic particles are selected from a group of materials consisting of ferromagnetic metals, their alloys, ferrites, carbonyl iron, iron phosphides, cobalt oxides, chromium oxides and iron oxides.

6. A composition according to claim 1 wherein said colloidal size magnetic particles are $Fe_3O_4$ particles.

7. A composition according to claim 1 wherein said colloidal size polishing particles have a mean particle size range from about 0.03 μm to about 0.05 μm.

8. A composition according to claim 1 wherein said colloidal size polishing particles are selected from a group consisting of α-$Fe_2O_3$, MgO, $SiO_2$, $MnO_2$, $Al_2O_3$, polycrystalline diamond, SiC, and $Si_3N_4$.

9. A composition according to claim 1 wherein said colloidal size polishing particles are $Al_2O_3$ particles.

10. A composition according to claim 1 wherein said carrying fluid is water.

11. A composition according to claim 1 wherein said carrying fluid is de-ionized water.

12. A composition according to claim 1 wherein said stabilizer is selected from a group consisting of anionic, cationic and non-ionic surfactants.

13. A composition according to claim 1 wherein said stabilizer is perchloric acid.

14. A composition according to claim 1 wherein said composition has a pH from about 1.5 to about 4.5.

15. A composition according to claim 1 wherein:
   said colloidal size magnetic particles comprise colloidal size $Fe_3O_4$ particles, said particles having a weight percent content in said composition ranging from about 20 to about 55 wt %;

said colloidal size polishing particles comprising colloidal size $Al_2O_3$ particles, said particles having a weight percent content in said composition ranging from about 1 to about 20 wt. %;

said at least one oxidizer comprising $Fe(NO_3)_3$, said $Fe(NO_3)_3$ having a weight percent content in said composition ranging from about 1 to about 10 wt. %;

said at least one inhibitor comprising $K_2Cr_2O_7$, said $K_2Cr_2O_7$ having a weight percent content in said composition ranging from about 0.01 to about 2 wt. %;

said at least one stabilizer comprising perchloric acid, said perchloric acid having a weight percent content in said composition ranging from about 0.5 to about 20 wt. %; and said carrying fluid, adjusted to a pH in the range of about 0.5 to about 5.5, comprising any remaining wt % of said composition.

16. A composition according to claim 1 wherein said magnetic particles, said polishing particles, said at least one stabilizer, said at least one oxidizer and said at least one inhibitor have weight percent contents in said composition ranging from about 20 to about 55 wt. %, from about 1 to about 20 weight percent (wt. %), from 0.05 to 20 wt %, from about 1 to about 10 weight percent (wt. %), and from about 0.01 wt % to 2 wt %, respectively.

17. A composition according to claim 1 wherein said magnetic particles, said polishing particles, said at least one stabilizer, said at least one oxidizer and said at least one inhibitor have weight percent contents in said composition ranging from about 25 to about 35 weight percent (wt. %), from about 3 to about 15 wt. %, from about 1 to about 8 wt. %, from about 2 to about 7 wt. %, and from about 0.03 to about 0.9 wt. %, respectively.

18. A method for preparing a composition according to claim 1, said method comprising the steps of:

preparing a dispersion of colloidal size magnetic particles with a stabilizer in a carrying fluid;

preparing a dispersion of colloidal size polishing particles in a carrying fluid;

adding to the colloidal size polishing particle dispersion at least one oxidizer and at least one inhibitor;

mixing said colloidal size magnetic particle dispersion and said colloidal size polishing particle dispersion to form a mixture; and adjusting the mixture to a final pH of about 0.5–5.5, if not already at that pH.

19. A method according to claim 18 further comprising the step of mixing a stabilizer in a carrier fluid prior to the preparing steps.

20. A method for preparing a composition according to claim 1, said method comprising the steps of:

preparing a dispersion of colloidal size magnetic particles with a stabilizer in a carrying fluid;

preparing a dispersion of colloidal size polishing particles in a carrying fluid;

adding to the colloidal size polishing particle dispersion at least one inhibitor;

mixing said colloidal size magnetic particle dispersion and said colloidal size polishing particle dispersion to form a mixture;

adjusting the pH of said mixture to a pH of about 0.5 to about 4.5, if said mixture is not already at that pH; and adding to the mixture an oxidizer immediately prior to use.

21. A magnetic polishing fluid composition comprising:

colloidal size magnetic particles, wherein said magnetic particles have a mean particle size range from about 0.01 μm to about 0.15 μm;

at least one stabilizer for stabilizing said colloidal size particles;

at least one oxidizer;

at least one inhibitor for inhibiting the rate of oxidation of the oxidizer; and a carrying fluid;

wherein the pH of said composition is in the range from about 0.5 to about 5.5.

22. A magnetic polishing fluid composition comprising:

colloidal size magnetic particles, wherein said magnetic particles have a mean particle size range from about 0.01 μm to about 0.15 μm;

colloidal size polishing particles, wherein said polishing particles have a mean particle size range from about 0.01 μm to about 0.1 μm;

at least one stabilizer for stabilizing said colloidal particles;

at least one oxidizer; and a carrying fluid;

wherein the pH of said composition is in a range from about 0.5 to about 5.5.

23. A magnetic polishing fluid composition comprising:

colloidal and non-colloidal magnetic particles, wherein said non-colloidal magnetic particles have a mean particle size range from about 0.15 μm to about 3.0 μm and wherein said colloidal magnetic particles have a mean particle size range from about 0.01 μm to about 0.15 μm;

colloidal size polishing particles, wherein said polishing particles have a mean particle size range from about 0.01 μm to about 0.1 μm;

at least one oxidizer;

at least one inhibitor for inhibiting the rate of oxidation of the oxidizer;

at least one stabilizer for stabilizing said colloidal particles;

an additive for adjusting viscosity, and a carrying fluid;

wherein the pH of said composition is in a range from between about 0.5 to about 5.5.

24. A magnetic polishing fluid according to claim 23 wherein said at least one oxidizer is selected from a group consisting of $Fe(NO_3)_3$, $H_2O_2$, $KIO_3$, and $K_3[Fe(CN)_6]$.

25. A magnetic polishing fluid according to claim 23 wherein said at least one inhibitor is selected from a group consisting of benzotriazol, toluidine, β-naphthylamine, $K_2Cr_2O_7$, $K_2MoO_4$ and $K_2CrO_4$.

26. A composition according to claim 23 wherein said non-colloidal size magnetic particles have a mean particle size range from about 0.05 μm to about 1.0 μm.

27. A composition according to claim 23 wherein said colloidal size magnetic particles have a mean particle size range from about 0.03 μm to about 0.05 μm.

28. A composition according to claim 23 wherein the ratio of said non-colloidal magnetic particles to said colloidal magnetic particles ranges from about 4.9:1 to about 6.1:1.

29. A composition according to claim 23 wherein the ratio of said non-colloidal magnetic particles to said colloidal magnetic particles ranges from about 5.3:1 to about 5.7:1.

30. A composition according to claim 23 wherein said colloidal size and non-colloidal size magnetic particles are selected from a group of materials consisting of ferromagnetic metals, their alloys, ferrites, carbonyl iron, iron phosphides, cobalt oxides, chromium oxides and iron oxides.

31. A composition according to claim 23 wherein said non-colloidal size magnetic particles are selected from a group consisting of $Fe_3O_4$ and carbonyl iron particles.

32. A composition according to claim 23 wherein said colloidal size magnetic particles are $Fe_3O_4$ particles.

33. A composition according to claim 23 wherein said colloidal size polishing particles have a mean particle size range from about 0.03 μm to about 0.05 μm.

34. A composition according to claim 23 wherein said colloidal size polishing particles are selected from a group consisting of α-$Fe_2O_3$, MgO, $SiO_2$, $MnO_2$, $Al_2O_3$, polycrystalline diamond, SiC, and $Si_3N_4$.

35. A composition according to claim 23 wherein said colloidal size polishing particles are $Al_2O_3$ particles.

36. A composition according to claim 23 wherein said carrying fluid is water.

37. A composition according to claim 23 wherein said carrying fluid is de-ionized water.

38. A composition according to claim 23 wherein said viscosity adjusting additive is a polar polymeric material.

39. A composition according to claim 23 wherein said viscosity adjusting additive is a polyalcohol.

40. A composition according to claim 39 wherein said viscosity adjusting additive is polyethylene glycol.

41. A composition according to claim 23 wherein said stabilizer is selected from a group consisting of anionic, cationic and non-ionic surfactants.

42. A composition according to claim 23 wherein said stabilizer is perchloric acid.

43. A composition according to claim 23 wherein said composition has a pH from about 1.5 to 4.5.

44. A composition according to claim 23 wherein:
said non-colloidal size magnetic particles are selected from a group consisting of carbonyl iron and magnetite particles, said particles having a weight percent content in said composition of from about 21 to about 38.5 wt %;
said colloidal size magnetic particles comprising colloidal size magnetite particles, said particles having a weight percent content in said composition from about 3 to about 7.5 wt %;
colloidal size polishing particles comprising colloidal size alumina particles, said particles having a weight percent content in said composition from about 1 to about 10 wt %;
a stabilizer comprising perchloric acid, said perchloric acid having a weight percent content in said composition from about 0.5 to about 10 wt. %;
an oxidizer comprising ferric nitrate, said ferric nitrate having a weight percent content in said composition ranging from about 1 to about 10 wt %;
an inhibitor comprising potassium dichromate, said potassium dichromate having a weight percent content in said composition ranging from about 0.01 to about 2 wt %;
a viscosity adjusting additive comprising polyethylene glycol, said glycol having a weight percent content in said composition from about 0.1 to about 5 wt. %; and
said carrying fluid, adjusted to a pH in the range of about 0.5 to about 5.5, comprising any remaining wt % of said composition.

45. A composition according to claim 23 wherein said non-colloidal size magnetic particles, said colloidal size magnetic particles, said colloidal size polishing particles, said at least one stabilizer, said viscosity additive, said at least one oxidizer and said at least one inhibitor have weight percent contents in said composition ranging from about 21 to about 38.5 wt. %, from about 3 to about 7.5 wt. %, from about 1 to about 10 wt. %, from about 0.5 wt. % to about 10 wt. %, from about 0.1 wt. % to about 5 wt. %, from about 1 wt. % to about 10 wt. %, and from about 0.01 to about 2 wt. %, respectively.

46. A composition according to claim 23 wherein said non-colloidal size magnetic particles, said colloidal size magnetic particles, said colloidal size polishing particles, said at least one stabilizer, said viscosity additive, said at least one oxidizer and said at least one inhibitor have weight percent contents in said composition of from about 25 to about 28 wt. %, from about 3.75 to about 5.25 wt. %, from about 3 to about 5 wt. %, from about 0.5 to about 5 wt. %, from about 1 to about 5 wt. %, from about 2 to about 7 wt. %, and from about 0.03 to about 1.2 wt. %, respectively.

47. A method for producing a composition according to claim 23, said method comprising the steps of:
preparing a dispersion of non-colloidal size magnetic particles by adding said particles to a mixture of a viscosity additive in a carrying fluid;
preparing a dispersion of colloidal size magnetic particles with a stabilizer in a carrying fluid;
preparing a dispersion of colloidal size polishing particles in a carrying fluid;
adding to the colloidal size polishing particle dispersion at least one oxidizer and at least one inhibitor;
mixing said colloidal size magnetic particle dispersion and said colloidal size polishing particle dispersion to form an intermediate mixture;
mixing said intermediate mixture with said non-colloidal size magnetic particle dispersion; and,
adjusting the pH of said composition to a pH in the range of about 0.5 to about 5.5.

48. A method according to claim 47 wherein the first mixing step comprises mixing said non-colloidal magnetic particle dispersion with said colloidal polishing particle dispersion to form an intermediate mixture and the second mixing step comprises mixing said intermediate mixture with said colloidal magnetic particle dispersion.

49. A method for producing a composition according to claim 23, said method comprising the steps of:
preparing a dispersion of non-colloidal size magnetic particles by adding said particles to a mixture of a viscosity additive in a carrying fluid;
preparing a dispersion of colloidal size magnetic particles with a stabilizer in a carrying fluid;
preparing a dispersion of colloidal size polishing particles in a carrying fluid;
adding to the colloidal size polishing particle dispersion at least one inhibitor;
mixing said colloidal size magnetic particle dispersion and said colloidal size polishing particle dispersion to form an intermediate mixture;
mixing said intermediate mixture with said non-colloidal size magnetic particle dispersion to form an intermediate composition;
adjusting the pH of said intermediate composition to a pH in the range from about 0.5 to about 5.5; and
adding at least one oxidizer to the intermediate composition immediately prior to use.

50. A magnetic polishing fluid composition comprising:
colloidal and non-colloidal magnetic particles, wherein said non-colloidal magnetic particles have a mean particle size range from about 0.15 μm to about 3.0 μm and wherein said colloidal magnetic particles have a mean particle size range from about 0.01 μm to about 0.15 μm;
at least one oxidizer;
at least one inhibitor for inhibiting the rate of oxidation of said oxidizer;
at least one stabilizer for stabilizing said colloidal particles;
an additive for adjusting viscosity, and
a carrying fluid;
wherein the pH of said composition is in a range from about 0.5 to about 5.5.

51. A magnetic polishing fluid composition comprising:
colloidal and non-colloidal magnetic particles, wherein said non-colloidal magnetic particles have a mean particle size range from about 0.15 μm to about 3.0 μm and wherein said colloidal magnetic particles have a mean particle size range from about 0.01 μm to about 0.15 μm;
colloidal size polishing particles, wherein said polishing particles have a mean particle size range from about 0.1 μm to about 0.1 μm;
at least one oxidizer;
at least one stabilizer for stabilizing said colloidal particles;
an additive for adjusting viscosity, and
a carrying fluid;
wherein the pH of said composition is in a range from between about 0.5 to about 5.5.

52. A magnetic polishing fluid composition comprising:
magnetic particles, wherein said magnetic particles have a mean particle size range from about 0.15 μm to about 3.0 μm;
colloidal size polishing particles, wherein said polishing particles have a mean particle size range from about 0.01 μm to about 0.1 μm;
at least one oxidizer;
at least one inhibitor for inhibiting the rate of oxidation by said oxidizer;
at least one stabilizer for stabilizing said colloidal particles;
an additive for adjusting viscosity; and
a carrying fluid;
wherein the pH of said composition is from about 0.5 to about 5.5.

53. A composition according to claim 52 wherein said at least one oxidizer is selected from a group consisting of $Fe(NO_3)_3$, $H_2O_2$, $KIO_3$, and $K_3[Fe(CN)_6]$.

54. A composition according to claim 52 wherein said at least one inhibitor is selected from a group consisting of benzotriazol, toluidine, β-naphthylamine, $K_2Cr_2O_7$, $K_2MoO_4$ and $K_2CrO_4$.

55. A composition according to claim 52 wherein said magnetic particles have a mean particle size range from about 0.5 to about 1.0 μm.

56. A composition according to claim 52 wherein said magnetic particles are selected from a group of materials consisting of ferromagnetic metals, their alloys, ferrites, carbonyl iron, iron phosphides, cobalt oxides, chromium oxides and iron oxides.

57. A composition according to claim 52 wherein said magnetic particle are $Fe_3O_4$ particles.

58. A composition according to claim 52 wherein said colloidal size polishing particles have a mean particle size range from about 0.03 μm to about 0.05 μm.

59. A composition according to claim 52 wherein said colloidal size polishing particles are selected from a group consisting of $\alpha$-$Fe_2O_3$, MgO, $SiO_2$, $MnO_2$, $Al_2O_3$, polycrystalline diamond, SiC, and $Si_3N_4$.

60. A composition according to claim 52 wherein said colloidal size polishing particles are $Al_2O_3$ particles.

61. A composition according to claim 52 wherein said carrying fluid is water.

62. A composition according to claim 52 wherein said carrying fluid is de-ionized water.

63. A composition according to claim 52 wherein said composition has a pH from about 1.5 to about 4.5.

64. A composition according to claim 52 wherein said viscosity additive is a polar polymeric material.

65. A composition according to claim 52 wherein said viscosity additive is a polyalcohol.

66. A composition according to claim 65 wherein said viscosity additive is polyethylene glycol.

67. A composition according to claim 52 wherein said stabilizer is chosen from a group consisting of anionic, cationic and non-ionic surfactants.

68. A composition according to claim 52 wherein said stabilizer is perchloric acid.

69. A composition according to claim 52 wherein:
said magnetic particles comprise magnetite particles, said particles having a weight percent content in said composition from about 20 to about 55 wt. %;
said colloidal size polishing particles comprise colloidal size alumina particles, said particles having a weight percent content in said composition from about 1 to about 20 wt. %;
said at least one stabilizer comprising perchloric acid, said perchloric acid having a weight percent content in said composition ranging from about 0.5 to about 20 wt. %;
said additive for adjusting viscosity comprising polyethylene glycol, said glycol having a weight percent content in said composition ranging from about 0.1 to about 10 wt. %;
an oxidizer comprising ferric nitrate, said ferric nitrate having a weight percent content in said composition ranging from about 1 to about 10 wt. %;
an inhibitor comprising potassium dichromate, said potassium dichromate having a weight percent content in said composition ranging from about 0.01 to about 2 wt. %; and
said carrying fluid, adjusted to a pH in the range of about 0.5 to about 5.5, comprising any remaining wt. % of said composition.

70. A composition according to claim 52 wherein said magnetic particles, said colloidal size polishing particles, said at least one stabilizer, said viscosity additive, said at least one oxidizer and said at least one inhibitor have weight percent contents in said composition ranging from about 20 to about 55 wt. %, from about 1 to about 20 wt. %, from about 0.5 wt. % to about 20 wt. %, from about 0.1 wt. % to about 10 wt. %, from about 1 wt. % to about 10 wt. % and from about 0.01 wt. % to about 2 wt. %, respectively.

71. A composition according to claim 52 wherein said magnetic particles, said colloidal size polishing particles, said at least one stabilizer, said viscosity additive, said at least one oxidizer and said at least one inhibitor have weight percent contents in said composition ranging from about 25 to about 35 wt. %, from about 3 to about 15 wt. %, from about 1 wt. % to about 8 wt. %, from about 1 wt. % to about 5 wt. %, from about 2 wt. % to about 7 wt. % and from about 0.03 wt. % to about 0.9 wt. %, respectively.

72. A method for producing a composition according to claim 52, said method comprising the steps of:
preparing a dispersion of magnetic particles by adding said particles to a viscosity additive in a carrying fluid;
preparing a colloidal size polishing particle dispersion with a stabilizer in a carrying fluid;
adding at least one oxidizer and at least one inhibitor to the colloidal size polishing particle dispersion;
mixing said dispersion of magnetic particles and said dispersion of colloidal size polishing particles to form a mixture; and
adjusting the pH of said mixture to a pH of about 0.5 to about 5.5, if said mixture is not already at that pH.

73. A method according to claim 72 further comprising a step of mixing a viscosity additive with a carrier fluid prior to the first preparing step.

74. A method according to claim 72 further comprising a step of mixing a stabilizer with a carrier fluid prior to the second preparing step.

75. A method for producing a composition according to claim 52, said method comprising the steps of:
preparing a dispersion of magnetic particles by adding said particles to a viscosity additive in a carrying fluid;
preparing a colloidal size polishing particle dispersion with a stabilizer in a carrying fluid;
adding at least one inhibitor to the colloidal size polishing particle dispersion;
mixing said dispersion of magnetic particles and said dispersion of colloidal size polishing particles to form an intermediate composition;
adjusting the pH of said intermediate composition to a pH in the range from about 0.5 to about 5.5 if said composition is not already in that range; and
adding at least one oxidizer to the intermediate composition immediately prior to use.

76. A magnetic polishing fluid composition comprising:
magnetic particles, wherein said magnetic particles have a mean particle size range from about 0.15 $\mu$m to about 3.0 $\mu$m;
at least one oxidizer;
at least one inhibitor for inhibiting the rate of oxidation by the oxidizer;
at least one stabilizer for stabilizing said colloidal particles;
an additive for adjusting viscosity; and
a carrying fluid;
wherein the pH of said composition is in a range from between about 0.5 to about 5.5.

77. A magnetic polishing fluid composition comprising:
magnetic particles, wherein said magnetic particles have a mean particle size range from about 0.15 $\mu$m to about 3.0 $\mu$m;
colloidal size polishing particles, wherein said polishing particles have a mean particle size range from about 0.01 to about 0.1 $\mu$m;
at least one oxidizer;
at least one stabilizer for stabilizing said colloidal size particles;
an additive for adjusting viscosity; and
a carrying fluid;
wherein the pH of said composition is in a range from about 0.5 to about 5.5.

78. A method for producing a composition according to claim 77, said method comprising the steps of:
preparing a dispersion of magnetic particles by adding said particles to a viscosity additive in a carrying fluid;
preparing a colloidal size polishing particle dispersion with a stabilizer in a carrying fluid;
adding at least one oxidizer to the colloidal size polishing particle dispersion;
mixing said dispersion of magnetic particles and said dispersion of colloidal size polishing particles to form a mixture; and
adjusting the pH of said mixture to a pH of about 0.5 to about 5.5.

79. A method for preparing a composition according to claim 23, said method comprising the steps of:
preparing a dispersion of colloidal size magnetic particles with a stabilizer in a carrying fluid;
preparing a dispersion of colloidal size polishing particles in a carrying fluid;
adding to the colloidal size polishing particle dispersion at least one oxidizer;
mixing said colloidal size magnetic particle dispersion and said colloidal size polishing particle dispersion to form a mixture; and
adjusting the mixture to a final pH of about 0.5–5.5.

80. A method for producing a composition according to claim 51, said method comprising the steps of:
preparing a dispersion of non-colloidal size magnetic particles by adding said particles to a mixture of a viscosity additive in a carrying fluid;
preparing a dispersion of colloidal size magnetic particles with a stabilizer in a carrying fluid;
preparing a dispersion of colloidal size polishing particles in a carrying fluid;
adding to the colloidal size polishing particle dispersion at least one oxidizer;
mixing said colloidal size magnetic particle dispersion and said colloidal size polishing particle dispersion to form an intermediate mixture;
mixing said intermediate mixture with said non-colloidal size magnetic particle dispersion; and,
adjusting the pH of said composition to a pH in the range of about 0.5 to about 5.5.

* * * * *